(12) United States Patent
Shuen et al.

(10) Patent No.: US 7,845,374 B2
(45) Date of Patent: Dec. 7, 2010

(54) GAS FILLING APPARATUS FOR PHOTOMASK BOX

(75) Inventors: Pan Yung Shuen, Taipei County (TW); Li Nien Chen, Taipei County (TW)

(73) Assignee: Gudeng Precision Industrial Co., Ltd., Taipei County (TW)

( * ) Notice: Subject to any disclaimer, the term of this patent is extended or adjusted under 35 U.S.C. 154(b) by 1100 days.

(21) Appl. No.: 11/541,545

(22) Filed: Oct. 3, 2006

(65) Prior Publication Data
US 2007/0298331 A1    Dec. 27, 2007

(30) Foreign Application Priority Data
Jun. 9, 2006    (TW) ............................... 95210935 U

(51) Int. Cl.
*B65B 1/04*    (2006.01)
(52) U.S. Cl. .............................. 141/92; 141/11; 141/63; 141/89; 141/98; 206/217
(58) Field of Classification Search ................ 141/4–8, 141/11, 63–67, 69, 85, 89, 92, 98; 206/711; 414/217
See application file for complete search history.

(56) References Cited
U.S. PATENT DOCUMENTS

| | | | | |
|---|---|---|---|---|
| 5,482,161 A * | 1/1996 | Williams et al. | ............ | 206/711 |
| 5,611,452 A * | 3/1997 | Bonora et al. | ............... | 220/378 |
| 5,788,458 A * | 8/1998 | Bonora et al. | ............... | 414/811 |
| 5,810,062 A * | 9/1998 | Bonora et al. | ............... | 141/351 |
| 5,988,233 A * | 11/1999 | Fosnight et al. | ............... | 141/63 |
| 6,135,168 A * | 10/2000 | Yang et al. | ..................... | 141/98 |
| 6,307,728 B1 * | 10/2001 | Leeser | ........................ | 361/234 |
| 6,368,411 B2 * | 4/2002 | Roberson et al. | ............ | 118/715 |
| 7,360,346 B2 * | 4/2008 | Miyajima et al. | ............. | 53/432 |
| 7,520,286 B2 * | 4/2009 | Davis et al. | ............. | 134/166 R |

* cited by examiner

*Primary Examiner*—Timothy L Maust
(74) *Attorney, Agent, or Firm*—Ming Chow; Sinorica, LLC

(57) ABSTRACT

A gas filling apparatus used to fill a photomask box with gas such as nitrogen or other inert gas. The gas filling apparatus of the present invention has a gas filling chamber provided with a plurality of first pillared elements, a plurality of second pillared elements, at least one gas inlet, at least one gas outlet, and a plurality of clamping elements; wherein the first pillared elements are used to couple with the recesses on a cover member of the photomask box, the second pillared elements are used to prop against the peripheral of a cover member of the photomask box, and the clamping elements respectively prop against two opposite sides of the cover member of photomask box, whereby the gas inlets and the gas outlets are respectively coupled with the through holes formed on the lower cover member of the photomask box and the gas can be filled into and exhausted from the photomask box.

8 Claims, 8 Drawing Sheets

GAS FILLING APPARATUS FOR PHOTOMASK BOX

BACKGROUND OF THE INVENTION

1. Field of the Invention

The present invention relates to semiconductor equipment, and more particularly to a gas filling chamber structure in gas filling apparatus for photomask box or wafer transport container.

2. Description of the Related Art

The photomask boxes are used in the semiconductor manufacturing process for conserving photomasks to properly protect them from contacting air or being polluted by dust when being transported between machines. In advanced semiconductor factories, the cleanliness of the photomask boxes are demanded to be better than Class 1, which is the requirement of Standard Mechanical Interface (SMIF), an IC manufacturing standard keeping the level of cleanliness of the pod.

However, in order to further improve the yield of product and reduce the cost of fabrication, not only should the requirement on cleanliness be met, but the pollution brought by exterior gases should also be eliminated. Such exterior gases have two sources other than air; first, outgassing from photomask boxes fabricated with polymer materials and second, volatile gas produced by diminutive quantity of residual chemical solution on the surface of photomasks. These unexpected gases produce fogging effect on the surface of photomasks, make the photomasks unusable and become scrap, and thus increase the fabrication cost.

Therefore, to fill the photomask box with gas such as nitrogen or other inert gases is one of the methods to solve the problem of fogging effect on the photomasks. Yet how to speedily and effectively fill the above-mentioned gases into the photomask box so that the photomasks placed in the photomask box can be kept in isolation from the air and other exterior gases and transformation of photomasks due to contact with air can be avoided is a technique that currently needs to be further developed.

BRIEF SUMMARY OF THE INVENTION

In view of the above mentioned problems, the present invention provides a gas filling apparatus for photomask box, especially the structure inside the filling chamber, which enables the user to speedily and safely fill the photomask box with inert gas, the flow of which brings away dust on the photomasks and gas and volatile chemical vapor emitted by the photomask box and thus eliminates the problem of fogging effect of photomasks. For this purpose, the present invention first provides a gas filling chamber structure of filling apparatus of particular gas, comprising a retention device, which is mounted on the peripheral area of said gas filling chamber through a plurality of protrusive elements, a fool-proof device, which is disposed in the inner side area of said retention device through a plurality of protrusive elements, a gas filling and exhausting device, which is coupledly disposed in the inner side area of said fool-proof device, and an operatable clamping device, which is coupledly disposed on the peripheral area of said gas filling chamber and interposedly deployed with part of said retention device.

The present invention then provides a gas filling apparatus for photomask box to fill a photomask box with at least one particular kind of gas; wherein the photomask box has a cover member, on which are disposed a plurality of through holes and a plurality of recesses to couple with the gas filling chamber. The gas filling chamber comprises a plurality of first pillared elements, a plurality of second pillared elements, a gas inlet device, and a gas outlet device, which are all fixedly disposed on the bottom surface of the gas filling chamber. Wherein, the plurality of recesses and the plurality of first pillared elements are fool-proof designs: when the photomask box is placed in the gas filling chamber, each of the plurality of first pillared elements is correspondingly embedded into the corresponding plurality of recesses respectively, at least a second pillared element props against each side of the cover member, and the gas inlet device and the gas outlet device are respectively and correspondingly coupled with the plurality of through holes on the cover member of the photomask box.

The present invention further provides a gas filling apparatus for photomask box to fill a photomask box with at least one particular kind of gas, comprising a manipulative interface, a control panel, and a plurality of gas filling chambers, wherein said gas filling chambers comprise a plurality of first protrusive elements, a plurality of second protrusive elements, a gas inlet device and a gas outlet device, all fixedly disposed on the bottom surface of said gas filling chambers. When a photomask box is placed in a gas filling chamber, the plurality of first protrusive elements and second protrusive elements prop against the peripheral of said photomask box, and the gas inlet device and the gas outlet device are respectively and correspondingly coupled with a through hole device on the bottom surface of the gas filling chamber.

In addition to photomask boxes, the features of the present invention can also be applied on wafer transport containers.

The gas to be filled in the present invention can be nitrogen, any kind of inert gases, dry cold air, carbon dioxide, or other cleansed gases that are less active.

DETAILED DESCRIPTION OF PREFERRED EMBODIMENTS

The present invention mainly discloses a structure of gas filling chamber in gas filling apparatus, therefore some parts of gas filling apparatus connected to the gas filling chamber such as the overall structure of the gas filling apparatus or the control panel can all be made using current techniques and will not be completely described. Moreover, the diagrams included in the following are not completely drawn according to the real size and are only used to demonstrate features related to the present invention.

Figure 1:
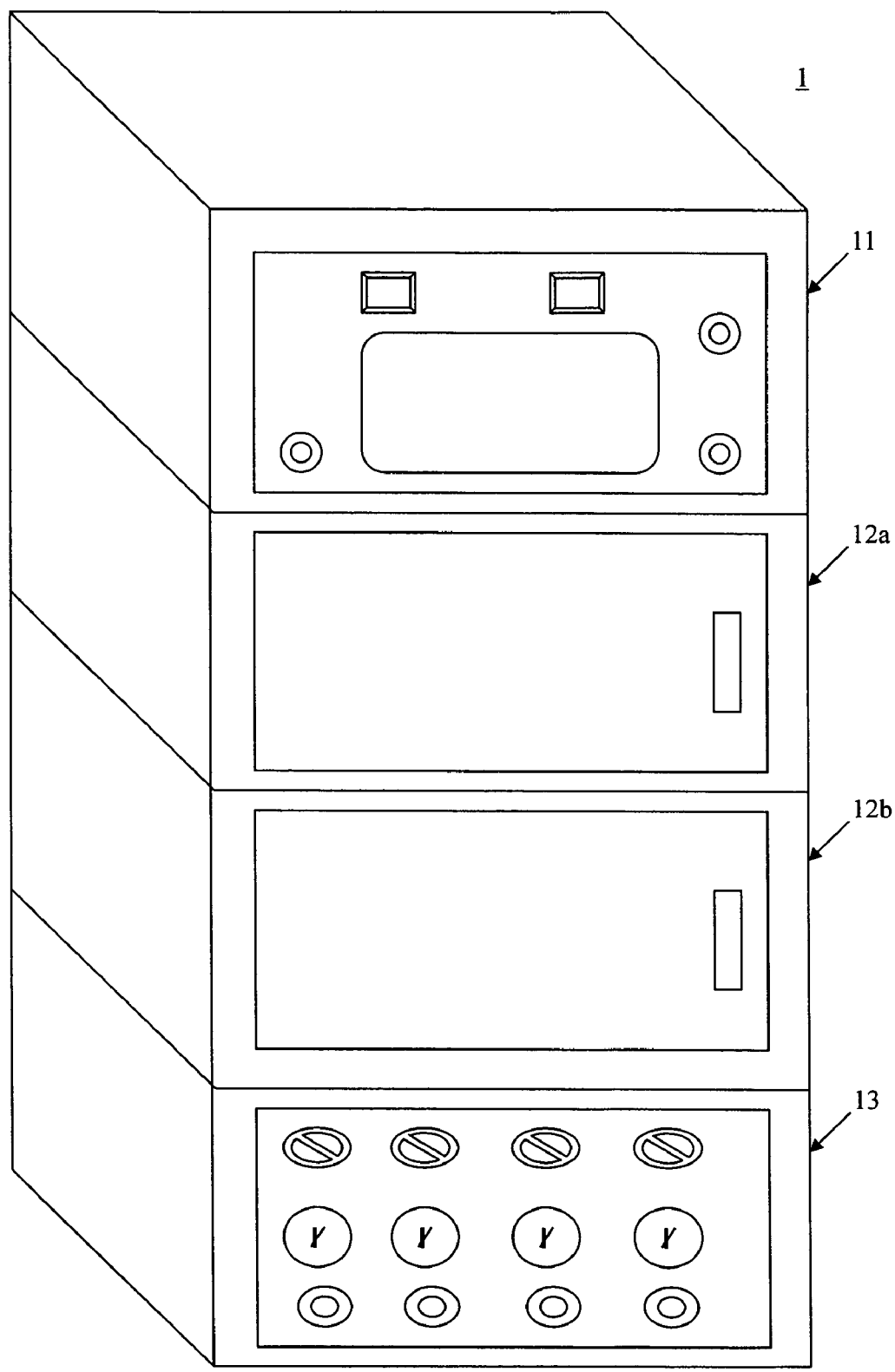
FIG. 1 is a perspective view illustrating the gas filling apparatus for photomask box according to one embodiment of the invention.

Referring to FIG. 1, a diagram showing the gas filling apparatus 1 for photomask box according to one embodiment of the invention, the gas filling apparatus 1 includes a manipulative interface 11, two gas filling chambers 12a and 12b, and a control panel 13. Herein, the mentioned number of the manipulative interface, the gas filling chambers, and the control panels are exemplified for illustration, and not limited by the present embodiment.

Figure 2:
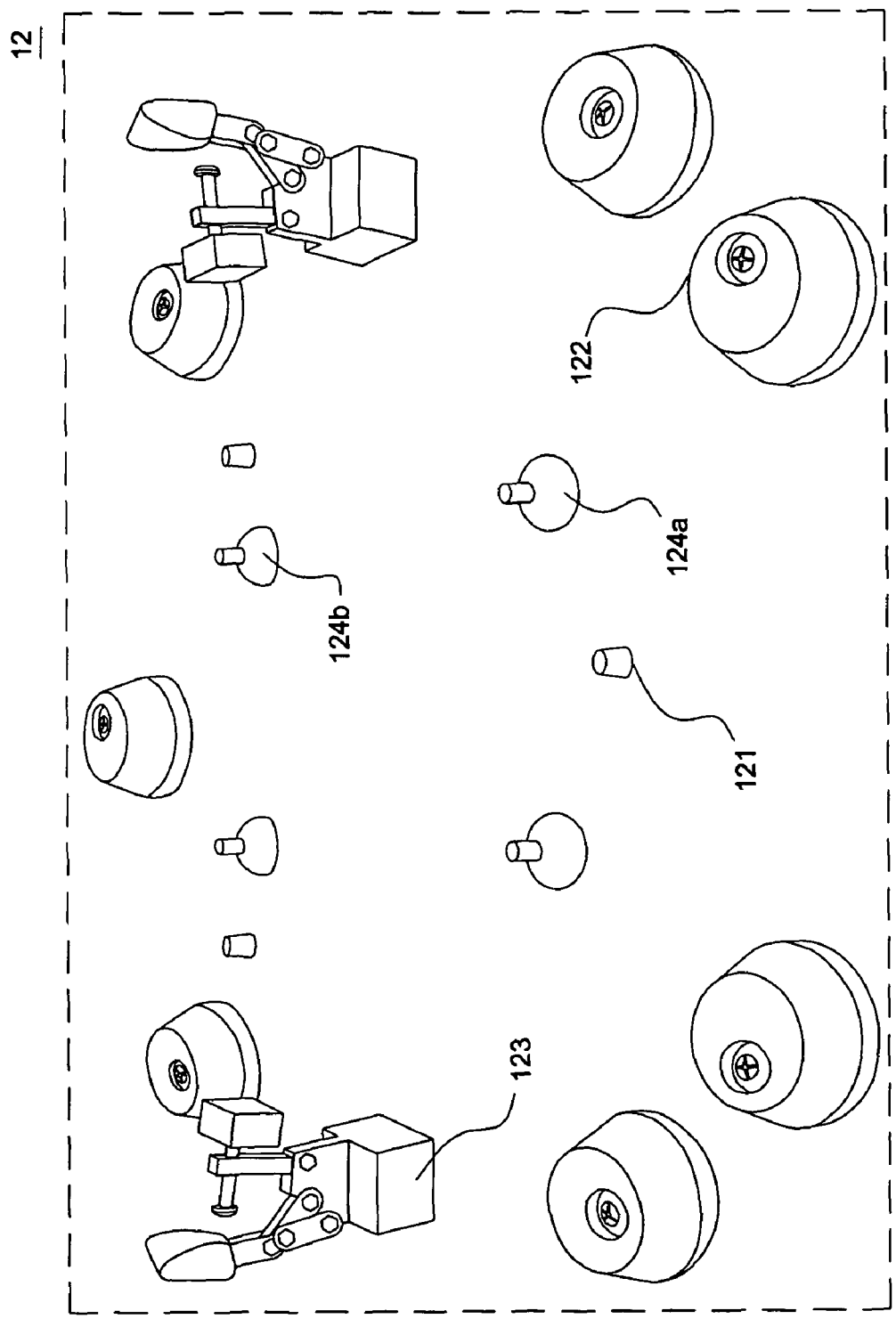
FIG. 2 is a perspective view illustrating the gas filling chamber of the gas filling apparatus in FIG. 1.
Figure 3:
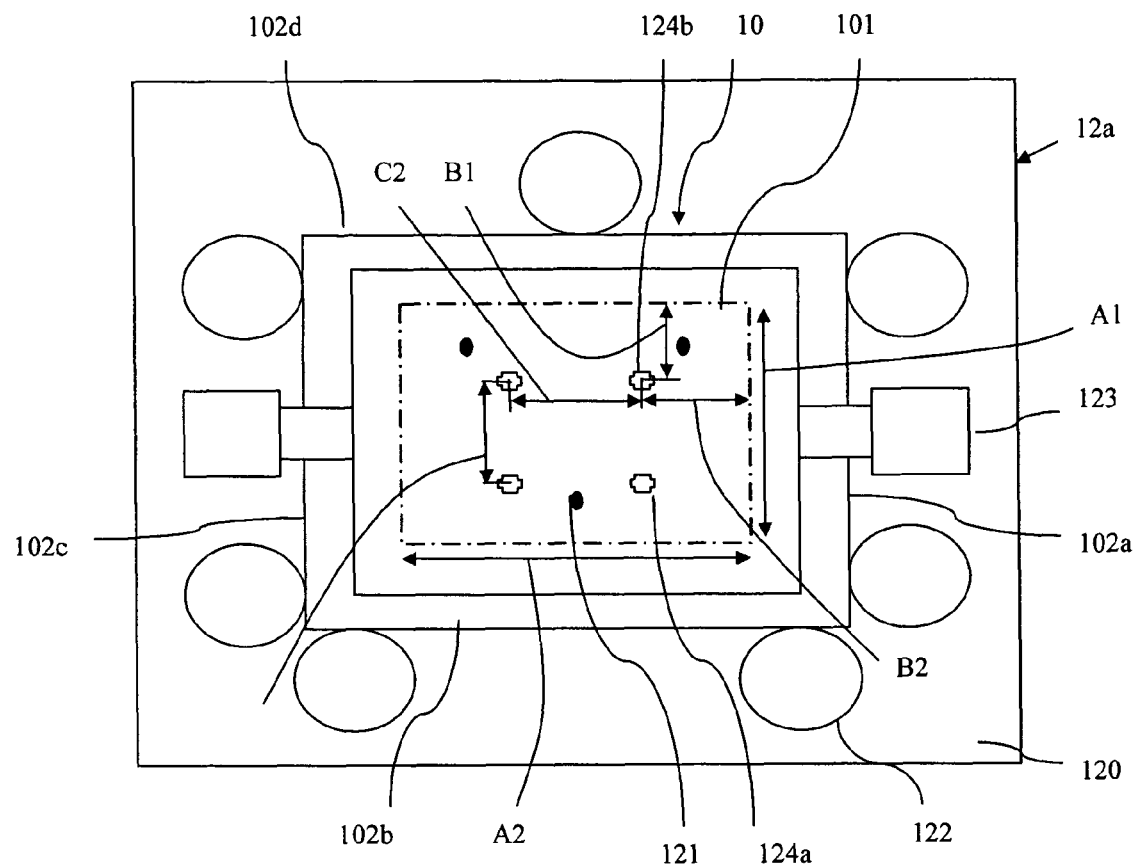
FIG. 3 is a top view illustrating the relationship between the elements inside the gas filling chamber according to one embodiment of the invention and a photomask box.

Referring to FIGS. 2 and 3, which are diagrams showing a gas filling chamber according to one embodiment of the present invention. In the present embodiment, the gas filling chambers 12a and 12b each provides a room for accommodating a photomask box 10 which is characterized in that the lower cover member 101 thereof is formed with at least one recess and at least two through holes on the bottom. However, it is preferable for the lower cover member 101 to have three recesses and four through holes. Thereof, each of the gas filling chambers 12a and 12b in the present embodiment includes at least one first protrusive element 121, a plurality of second protrusive elements 122, a plurality of clamping elements 123, at lest one gas inlet 124a, and at least one gas outlet 124b. Obviously, the number of each piece in the gas filling chamber corresponds to the design of the photomask the gas filling chamber 12a or 12b. Detailed description is as follows.

In the present embodiment, the number of first protrusive elements 121 is three, the number of second protrusive elements 122 is seven, the number of clamping elements 123 is two, the number of gas inlets 124a is two, and the number of gas outlets 124b is two. Three first protrusive elements 121 that are in cylinder shape are fixedly disposed on the bottom surface 120 of gas filling chamber 12a. They are triangularly positioned and respectively correspond to three recesses (not shown) on the bottom surface of the lower cover member 101 of photomask box 10 in order to be embedded into the recesses of the lower cover member 101 of the photomask box and thus fix the photomask box 10 to the bottom surface 120. What should be emphasized here is that the recesses on the photomask box 10 can also be disposed on the upper cover member, and thus gas can also be filled from the upper cover member of the photomask box. Moreover, another recess (not shown) is further disposed on the lower cover member 101 of the photomask box 10 to form a fool-proof design with the first protrusive elements 121 to make the fixing of the photomask 10 on the bottom surface 120 directional. Therefore the user while That is to say, the incorrect assembling with the photomask 10 and the situation that the through holes of the photomask box 10 are not aligned with the gas inlets 124a and the gas outlets 124b can be avoided.

On the other hand, a plurality of cylinder-like second protrusive elements 122 are fixedly disposed on the bottom surface 120 of gas filling chamber 12a serving as buffer blocks. In the present embodiment, seven cylinder-like second protrusive elements 122 are used as the above mentioned buffer blocks for propping against the peripheral of the photomask box 10 and fixing the photomask box 10 on the bottom surface 120 of gas filling chamber 12a. Specifically, there is at least one second protrusive element 122 to prop against each side of the photomask box 10. For example, two second protrusive elements 122 prop against the first side 102a of the photomask box 10, two second protrusive elements 122 prop against the second side 102b of the photomask box 10, two second protrusive elements 122 prop against the third side 102c of the photomask box 10, and one second protrusive element 122 props against the fourth side 102d of the photomask box 10.

Furthermore, referring to FIG. 3, in a preferred situation, the number of gas inlets 124a is two and the number of gas outlets 124b is two, and the disposition of gas inlets 124a and gas outlets 124b correspond to the disposition of through holes on the lower cover member 101 of photomask box 10. FIG. 3 demonstrates the size of longer side A1 of lower cover member 101, the size of shorter side A2, the distance B1 between the center of a through hole on photomask box 10 corresponding to either gas inlets 124a or gas outlets 124b and the longer side of lower cover member 101, the distance B2 between the center of said through hole and the shorter side of lower cover member 101, and the distances C1 and C2 between the centers of two adjacent through holes. For example, in one embodiment, both A1 and A2 are 196.014 mm, B1 is 74.507 mm, B2 is 58.007 mm, C1 is 95 mm, and C2 is 80 mm. And in another embodiment, both A1 and A2 are 196.014 mm, B1 is 54.507 mm, B2 is 58.007 mm, C1 is 115 mm, and C2 is 80 mm. And A1 and A2 can also be designed to be 196 mm, B1 to be 39.5 mm, B2 to be 53 mm, C1 to be 133.5 mm, and C2 to be 90 mm.

In addition, there are two gas inlets 124a and two gas outlets 124b fixedly disposed on the bottom surface 120 of the gas filling chamber 12a that correspond to four through holes formed on the bottom surface of the lower cover member 101 of the photomask box 10. Two gas inlets 124a correspond to two of the four through holes (not shown) on the bottom surface of lower cover member 101 of photomask box 10, and two gas outlets 124b correspond to two other through holes (not shown) on the bottom surface of lower cover member 101 of photomask box 10. What should again be emphasized here is that the purpose of disposing gas inlets and gas outlets on the photomask box is to allow gas in the box to be exhausted, i.e. outgassing, and clean gas to be filled, i.e. intaking, after the photomask box is fixedly connected with corresponding elements of the gas filling chamber, and thus the number and disposition of gas inlets and outlets in the present embodiment are not to limit the invention but only for illustrating an embodiment. And the clean gas filled can be nitrogen, any kind of inert gases, carbon dioxide, dry cold air, other cleansed gases that are less active, or the hybrid of any of the above gases.

Figure 4:
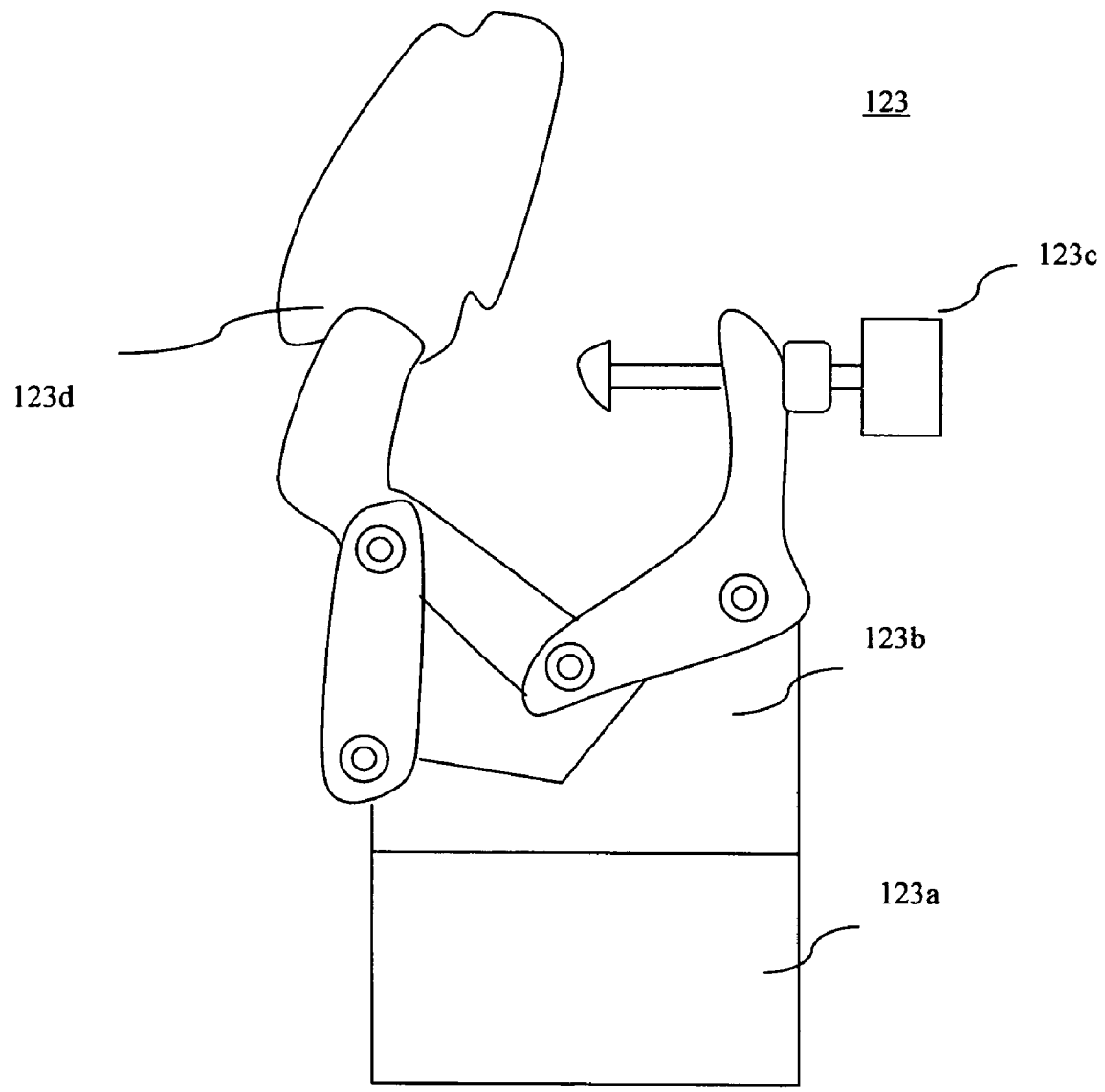
FIG. 4 is a front view illustrating a first state of the clamping elements mounted on the gas filling chamber in FIG. 2.
Figure 5:
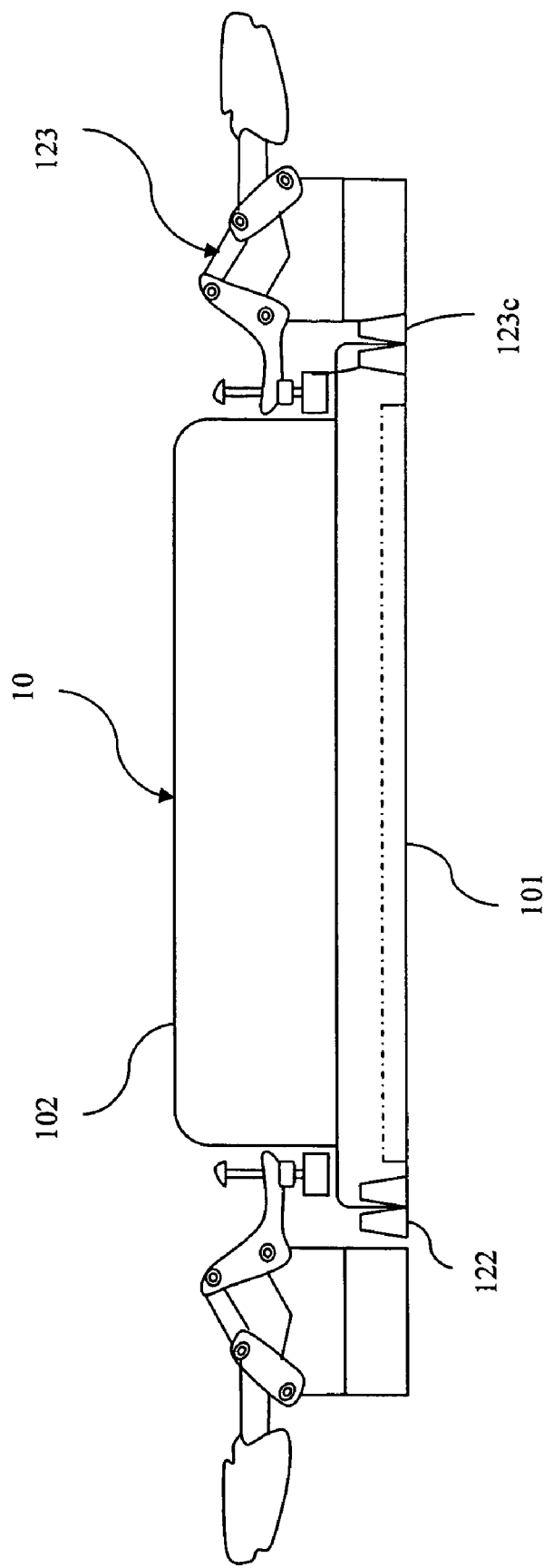
FIG. 5 is a front view illustrating the clamping elements in FIG. 4 propping against the photomask box after the photomask box is put in the gas filling chamber of the gas filling apparatus according to one embodiment of the invention.

Furthermore, referring to FIGS. 4 & 5, there are two clamping elements 123 fixedly disposed on the bottom surface 120 of the gas filling chamber 12a to respectively prop against two opposite sides of the photomask box 10 for avoiding any possible vertical shift of the photomask box 10 on the bottom surface 120 of the gas filling chamber 12a. Herein, the clamping elements 123 are a linkage mechanism, such as a four-bar mechanism including a base 123a, a fixing rod 123b, a fixing block 123c and a holding rod 123d.

Referring to FIGS. 3 & 5, according to the disposition of the photomask box 10 and the gas filling chamber 12a or 12b, when the photomask box 10 is put onto the gas filling chamber 12a or 12b, the first protrusive elements 121 are embedded into corresponding recesses on the photomask box 10, the second protrusive elements 122 respectively prop against the peripheral of the photomask box 10, two clamping elements 123 respectively prop against two opposite sides of the photomask box 10 with the fixing blocks 123c, and the gas inlets 124a and gas outlets 124b are respectively coupled with corresponding through holes on the photomask box 10. Therefore, a particular clean gas can be injected into the photomask box 10 through the gas inlets 124a and exhausted through the gas outlets 124b.

Figure 8:
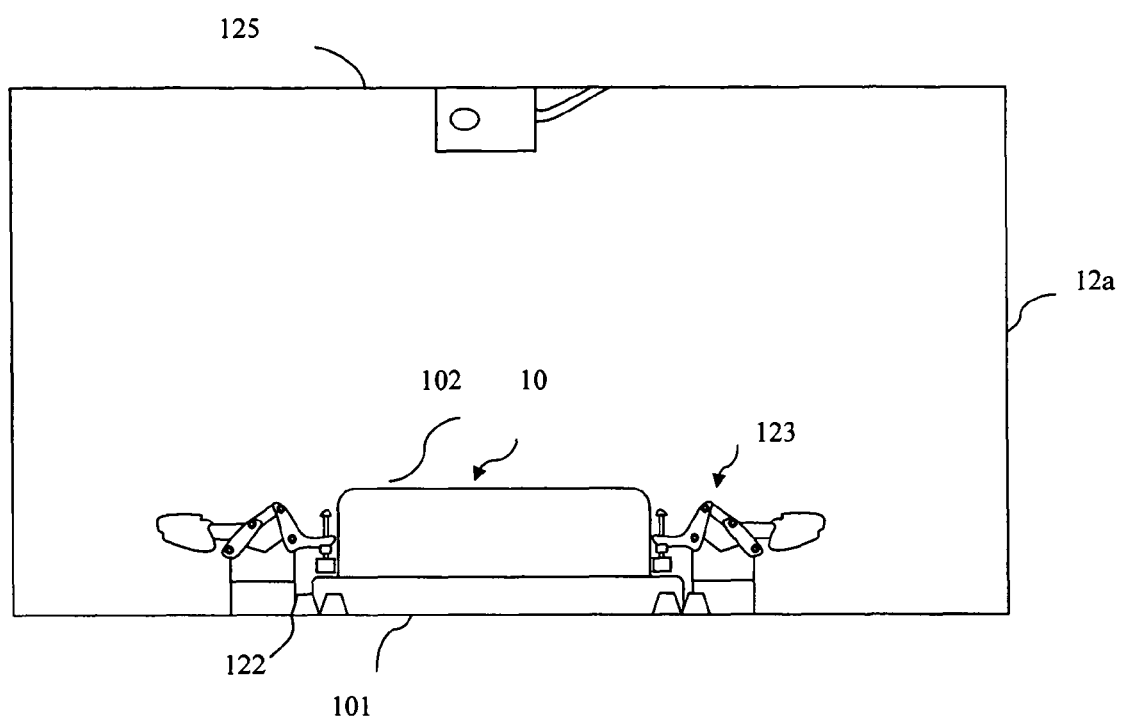
FIG. 8 is a schematic view illustrating the ion generator mounted on top of the gas filling chamber as shown in FIG. 2.

Moreover, referring to FIG. 8, a diagram demonstrating an embodiment in which the gas filling chamber 12*a* or 12*b* of the present invention can further include an ion generator 125. In the present invention, the ion generator 125 can be used to generate and emit ions to counteract the static electricity effect in the gas filling chamber 12*a* or 12*b*. As for the disposing number and position of ion generator 125, there is no limit applied in the present invention, as long as the ion generator is disposed in proper space in the gas filling chamber. For example, two ion generators 125 can be disposed in the gas filling chamber 12*a* or 12*b*, wherein one ion generator 125 generates and emits ions to counteract the static electricity effect in the gas filling chamber 12*a* or 12*b* and the other ion generator 125 emits ions into the photomask box through a tube (not shown) to counteract the static electricity effect in the photomask box.

Figure 6:
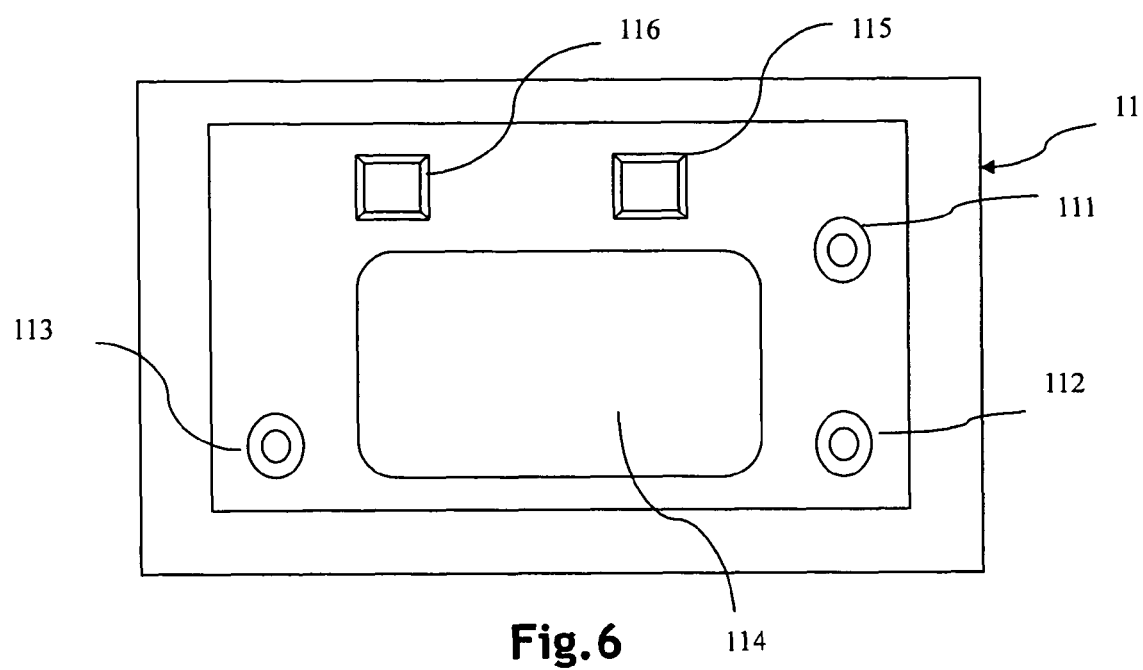
FIG. 6 is a schematic view illustrating the control panel and the display screen of the gas filling apparatus as shown in FIG. 1.
Figure 7:
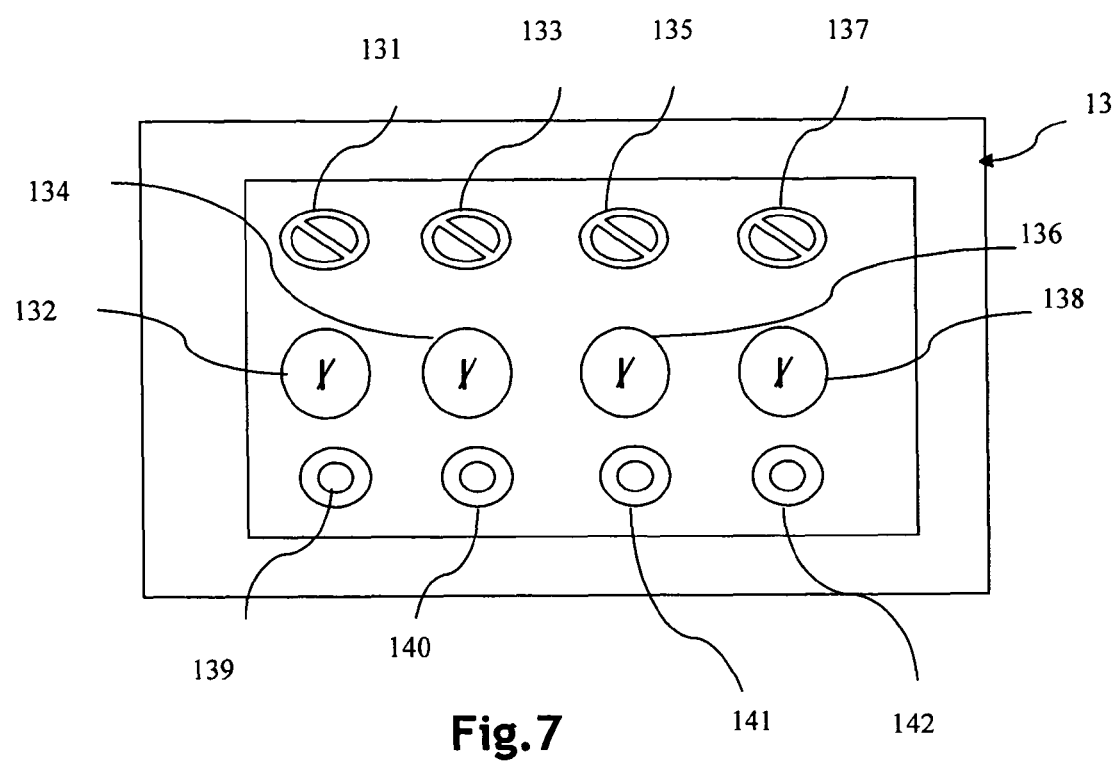
FIG. 7 is a schematic view illustrating the control panel of the gas filling apparatus as shown in FIG. 1.

Referring to FIG. 6, the gas filling apparatus 1 for photomask box 10 according to one embodiment of the invention has a manipulative interface 11 which thereon assembles an emergency switch 111, two operation activating buttons 112 and 113 for the gas filling chambers 12*a* and 12*b* respectively, a parameter setting display screen 114, and two flow indicators 115 and 116 for the gas filling chambers 12*a* and 12*b* respectively.

The emergency switch 111 is used to cut off the power supply of the gas filling apparatus 1 under emergency, the operation activating button 112 for the gas filling chamber 12*a* is used to start the gas flowing inside the gas filling chamber 12*a*, the operation activating button 113 for the gas filling chamber 12*b* is used to start the gas flowing inside the gas filling chamber 12*b*, the flow indicator 115 is used to monitor the gas flowing inside the gas filling chamber 12*a*, and the flow indicator 116 is used to monitor the gas flowing inside the gas filling chamber 12*b*.

Besides, the parameter setting display screen 114 is used to set parameters such as gas flow rate, gas pressure, and gas filling time etc. and monitor gas filling condition inside the gas filling chamber 12*a* and 12*b*.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. For example, the protrusive elements according to the embodiments of the invention can be in shapes other than that of cylinder. Therefore, the scope of the appended claims should be accorded the broadest interpretation so as to encompass all such modifications and similar arrangements.

What is claimed is:

1. A gas filling apparatus for photomask box adapted to fill a photomask box with at least one particular gas, said gas filling apparatus comprising a gas filling chamber, said photomask box comprising a cover member, said cover member being disposed with a plurality of through holes and a plurality of recesses, which are used to be coupled with said gas filling chamber, the improvement of said gas filling chamber comprising:

three protrusive pillars, fixedly disposed on a bottom surface of said gas filling chamber;

seven buffer blocks, fixedly disposed on said bottom surface of said gas filling chamber;

at least one gas inlet, fixedly disposed on said bottom surface of said gas at least one gas outlet, fixedly disposed on said bottom surface of said gas filling chamber;

a plurality of clamping elements, fixedly disposed on said bottom surface of said gas filling chamber; and an ion generator, disposed in said gas filling chamber for generating and emitting ions;

wherein the position of said protrusive pillars being a triangular configuration, said protrusive pillars being correspondingly and respectively embedded into said plurality of recesses, at least one of said buffer blocks propping against each side of said cover member, said plurality of clamping elements respectively propping against two opposite sides of said cover member, and said gas inlet and said gas outlet being respectively coupled with said plurality of through holes when said photomask box is placed in said gas filling chamber.

2. The gas filling apparatus for photomask box according to claim 1, wherein said buffer blocks being in shape of cylinder.

3. The gas filling apparatus for photomask box according to claim 1, wherein said particular gas is selected from the group consisting of pure nitrogen, inert gases, carbon dioxide, dry cold air, or other cleansed gases that are less active, or the hybrid of any of the above.

4. The gas filling apparatus for photomask box according to claim 1, wherein the sizes of said each side of said cover member being 196.014 mm, the distance between the center of said plurality of through holes and one of said each side of said cover member being 58.007 mm, the distance between the center of said plurality of through holes and one of said each side of said cover member being 74.507 mm, and the distances between the centers of two of said plurality of through holes that are adjacent being 95 mm and 80 mm.

5. The gas filling apparatus for photomask box according to claim 1, wherein the sizes of said each side of said cover member being 196.014 mm, the distance between the center of said plurality of through holes and one of said each side of said cover member being 54.507 mm, the distance between the center of said plurality of through holes and one of said each side of said cover member being 58.007 mm, and the distances between the centers of two of said plurality of through holes that are adjacent being 115 mm and 80 mm.

6. The gas filling apparatus for photomask box according to claim 1, wherein the sizes of said each side of said cover member being 196 mm, the distance between the center of said plurality of through holes and one of said each side of said cover member being 39.5 mm, the distance between the center of said plurality of through holes and one of said each side of said cover member being 53 mm, and the distances between the centers of two of said plurality of through holes that are adjacent being 133.5 mm and 90 mm.

7. The gas filling apparatus for photomask box according to claim 1, wherein said plurality of clamping elements coupledly disposed on the peripheral area of said bottom surface and interposedly deployed with part of said buffer blocks.

8. The gas filling apparatus for photomask box according to claim 1, wherein each said clamping element being a linkage mechanism.

* * * * *